(12) United States Patent
Devendorf et al.

(10) Patent No.: US 6,879,276 B2
(45) Date of Patent: Apr. 12, 2005

(54) SPLIT CELL BOWTIE DIGITAL TO ANALOG CONVERTER AND METHOD

(75) Inventors: Don C. Devendorf, Carlsbad, CA (US); Erick M. Hirata, Torrance, CA (US); Lloyd F. Linder, Agoura Hills, CA (US); Christopher B. Langit, Gardena, CA (US); Roger N. Kosaka, Torrance, CA (US)

(73) Assignee: TelASIC Communications, Inc., El Segundo, CA (US)

( * ) Notice: Subject to any disclaimer, the term of this patent is extended or adjusted under 35 U.S.C. 154(b) by 0 days.

(21) Appl. No.: 10/739,860

(22) Filed: Dec. 18, 2003

(65) Prior Publication Data

US 2005/0035892 A1 Feb. 17, 2005

Related U.S. Application Data

(60) Provisional application No. 60/495,742, filed on Aug. 14, 2003.

(51) Int. Cl.[7] .............................................. H03M 1/66
(52) U.S. Cl. ...................................... 341/144; 341/153
(58) Field of Search .......................... 341/143, 144–154

(56) References Cited

U.S. PATENT DOCUMENTS

| | | | | |
|---|---|---|---|---|
| 5,283,580 A | * | 2/1994 | Brooks et al. ............... | 341/145 |
| 5,296,857 A | * | 3/1994 | Carobolante ................ | 341/144 |
| 5,729,231 A | * | 3/1998 | Kikuchi ...................... | 341/144 |
| 5,825,317 A | * | 10/1998 | Anderson et al. ........... | 341/120 |
| 5,920,273 A | * | 7/1999 | Hirano ........................ | 341/144 |
| 6,608,577 B2 | * | 8/2003 | Nishimura .................. | 341/144 |
| 6,617,989 B2 | * | 9/2003 | Deak .......................... | 341/144 |

* cited by examiner

Primary Examiner—Michael Tokar
Assistant Examiner—Linh V Nguyen
(74) Attorney, Agent, or Firm—Morrison & Foerster LLP

(57) ABSTRACT

A DAC (10) including an operational amplifier (12) having an input terminal; a plurality of current paths coupled to the input terminal; a plurality of current sources ($I_1/2 - I_4/2$); and an arrangement (11) for switchably coupling current from at least two of the cells to a respective one of the paths in response to an input signal. In a specific embodiment, the inventive DAC (10) further includes a first resistive element ($2R_1-2R_4$) disposed in each of the current paths, a second resistive element ($R_1-R_4$) disposed between the current paths, and a feedback resistor ($R_F$) disposed between an output terminal of the amplifier and the input terminal thereof. In the illustrative embodiment, the coupling arrangement includes a plurality of switches ($SW_1-SW_4$); each of the switches is adapted to switch half of the current from a first source and half of the current from a second source into a respective one of the paths. The invention is adapted to lower the distortion of digital to analog converters by improving differential nonlinearities and integral nonlinearities, caused primarily by current source gradient errors, without the need for trimming.

5 Claims, 5 Drawing Sheets

SPLIT CELL BOWTIE DIGITAL TO ANALOG CONVERTER AND METHOD

CROSS-REFERENCE TO RELATED APPLICATIONS

This application claims the benefit of United States Provisional Application No. 60/495,742, filed Aug. 14, 2003, the disclosure of which is hereby incorporated by reference.

BACKGROUND OF THE INVENTION

1. Field of the Invention

The present invention relates to electrical and electronic components, circuits and systems. More specifically, the present invention relates to digital to analog converters.

2. Description of the Related Art

Digital to analog converters are widely used for converting digital signals to analog signals for many electronic circuits. For example, a high resolution, high speed digital to analog converter (DAC) may find application in video circuits, high quality audio, instrumentation applications, and in the transmit path for high dynamic range communications applications. DACs may also be used in high speed analog to digital converters (ADCs) such as successive approximation ADCs or subranging ADCs.

As is known in the art, the function of an analog to digital converter (ADC) is to accurately convert an analog input signal into a digital output represented by a coded array of binary bits. The output bits are generated by processing the analog input signal through a number of comparator steps. There are several types of ADC architectures, each architecture having different characteristics, such as bandwidth, speed, power, and resolution. A flash ADC, for example, produces an N-bit digital output in one step with $2^N-1$ parallel comparators. Flash ADCs provide higher speed of conversion, but are limited by higher input capacitance, power consumption, and device yield constraints associated with the high number of comparators in the circuitry. At the other extreme, a successive approximation ADC produces an N-bit digital output in N sequential steps using a single comparator. Successive approximation ADCs are simple in structure, and may be very accurate, but they have very slow conversion times due to the serial nature of the conversion process.

Subranging ADCs provide an intermediate compromise between flash ADCs and successive approximation ADCs. Subranging ADCs typically use a low resolution flash quantizer during a first or coarse pass to convert the analog input signal into the most significant bits (MSB) of its digital value. A digital to analog converter (DAC) then generates an analog version of the MSB word, which is subtracted from the input signal at a summing node to produce a residue or residual signal. The residue signal is sent through one or more fine passes (through the same quantizer or additional low resolution quantizers) to produce the lower significant bits of the input signal. The lower significant bits and the MSB word are then combined by digital error correcting circuitry to produce the desired digital output word.

A common type of DAC, the current summing DAC, generates an analog output signal by selectively switching a number of current sources (or cells) into or out of a current summing device in response to a digital input signal. Because of process variables, the multiple current sources required by the DAC cannot be fabricated to exact values. In fact, current sources can vary from one to the next, even on the same die. These inaccuracies result in distortions in the analog output signal. The current sources therefore need to be trimmed to meet the accuracy requirements of the DAC. They can be trimmed to equal one another (unary DACs) or to provide currents with binary weights (binary DACs).

Conventionally, this trimming is accomplished in various ways. A straightforward method is to trim the current setting resistors of the current sources with a laser, in effect changing the value of the resistor chain by burning material off to raise the resistance. This process can only be implemented prior to packaging and therefore will not be able to correct for any post-trim stresses the chip might encounter during cleaning, packaging and sealing. Because the resistors are subject to change when stressed, they must be placed on the chip in locations that will minimize the stress they experience. This impacts and limits the IC layout.

There are other approaches that allow for resistor trimming after packaging, but they generally require significant pad areas because of the high voltages and/or currents required to blow fuse links. These restrictions limit the number of corrections that can be made, thereby limiting the overall resolution or dynamic range of the DAC.

Hence, there is a need in the art for a system or method for lowering distortion of digital to analog converters and analog to digital converters that mitigates the need for trimming after packaging.

SUMMARY OF THE INVENTION

The need in the art is addressed by a digital to analog converter implemented in accordance with the teachings of the present invention. Generally, the inventive DAC includes an operational amplifier having an input terminal; a plurality of current paths coupled to the input terminal; a plurality of current sources; and an arrangement for switchably coupling current from at least two of the cells to a respective one of the paths in response to an input signal.

In a specific embodiment, the inventive DAC further includes a first resistive element disposed in each of the current paths, a second resistive element disposed between the current paths, and a feedback resistor disposed between an output terminal of the amplifier and the input terminal thereof. In the illustrative embodiment, the coupling arrangement includes a plurality of switches; each of the switches is adapted to switch half of the current from a first source and half of the current from a second source into a respective one of the paths.

The invention offers improvements in Differential Non-linearity (DNL) and Integral Non-linearity (INL) of both unary and binary digital to analog converters (DACs) for a large class of current source errors. Receiving particular benefit are current source errors that are called gradient errors. These errors can be $V_{BE}$, resistor, Beta, thermal gradients, or process variations (random or statistical), but the invention works particularly well on statistical errors. The present invention facilitates reductions in linear gradient DNL and INL errors. DNL and INL errors caused by other types of gradients are also improved as are errors that affect individual current cells. By recognizing that gradient type errors generally increase or decrease across the array of current cells, the invention splits and then recombines the current cells in such a way as to average the errors across an array.

DESCRIPTION OF THE INVENTION

Illustrative embodiments and exemplary applications will now be described with reference to the accompanying drawings to disclose the advantageous teachings of the present invention.

While the present invention is described herein with reference to illustrative embodiments for particular applications, it should be understood that the invention is not limited thereto. Those having ordinary skill in the art and access to the teachings provided herein will recognize additional modifications, applications, and embodiments within the scope thereof and additional fields in which the present invention would be of significant utility.

Figure 1:
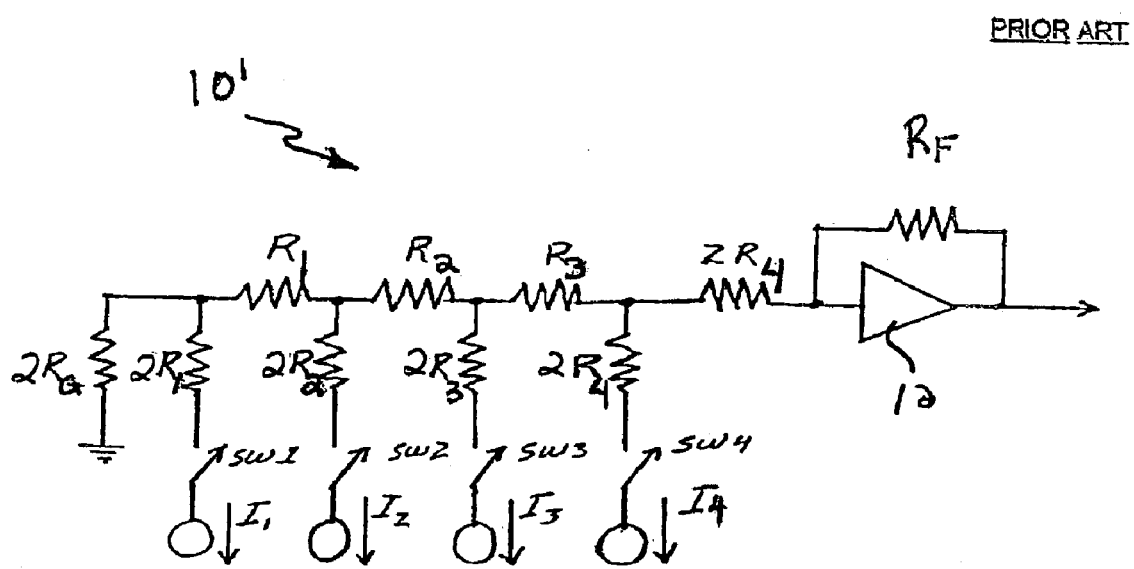
FIG. 1 shows an illustrative implementation of a four bit DAC in accordance with conventional teachings.

FIG. 1 shows an illustrative implementation of a four bit DAC in accordance with conventional teachings. The system 10' has an operational amplifier 12 with a feedback resistor $R_F$. Four current sources $I_1$–$I_4$ are selectively connected to the amplifier 12 by switches $SW_1$–$SW_4$ and resistors $2R_1$–$2R_4$ respectively and resistors $R_1$–$R_4$. Ideally, each of the current sources will output the same current, i.e., $I_1=I_2=I_3=I_4$. However, if there is a gradient error across the array, one might find that $I_1=K_1I_1$, $I_2=K_2I_1$, $I_3=K_3I_1$, and $I_4=K_4I_1$ where $K_n$ increases or decreases with n. This may cause gradient errors in DACs and the circuits in which they are employed including DNL and INL distortion. A gradient error is one that affects the current sources as the sources are physically arrayed on the die. Gradient errors can be caused by $V_{BE}$, resistor, Beta, thermal gradients, process variation, stress or any other physical phenomenon that varies with cell position. An example of a linear gradient would be if $I_1=I_1$, $I_2=I_1+\Delta I$, $I_3=I_1+2\Delta I$ and $I_4=I_1+3\Delta I$, etc. In accordance with the present teachings, these errors may be mitigated by splitting each current source or cell in two as shown in FIG. 2.

Figure 2:
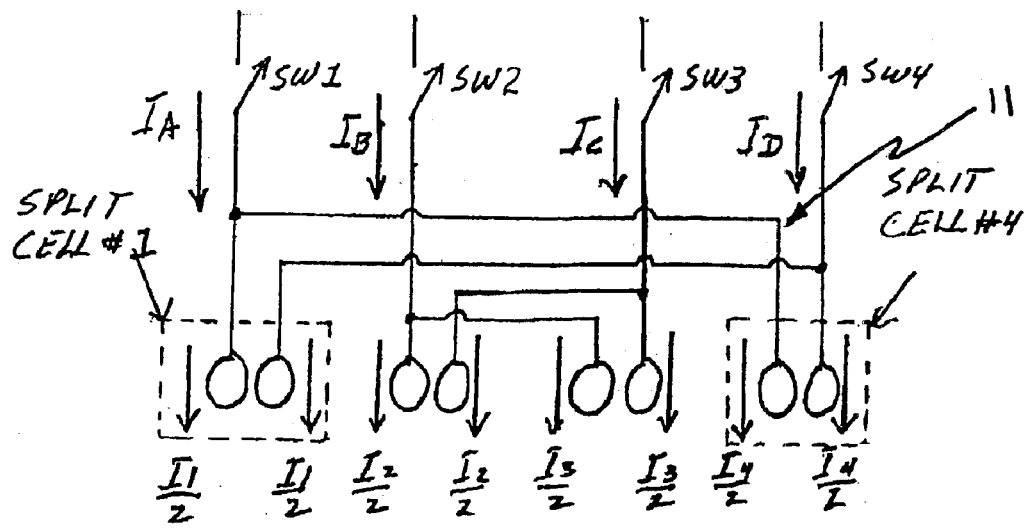
FIG. 2 shows a split cell implementation of 4 current sources $I_A$–$I_D$ in a nested butterfly configuration in accordance with an illustrative embodiment of the teachings of the present invention.

FIG. 2 shows a split cell implementation of 4 current sources $I_A$–$I_D$ in a nested butterfly configuration in accordance with an illustrative embodiment of the teachings of the present invention. The embodiment of FIG. 2 is similar to that of FIG. 1 with the exception of a novel routing arrangement 11 which cross-couples the outputs of, in this case, two current sources. Thus, in FIG. 2, $I_A=(I_1+I_4)/2$, $I_B=(I_2+I_3)/2$, $I_C=(I_3+I_2)/2$ and $I_D=(I_4+I_1)/2$, where $I_1=K_1I_1$, $I_2=K_2I_1$, etc. Hence, $I_A=I_1(K_1+K_4)/2$, $I_B=I_1(K_2+K_3)/2$, $I_C=I_1(K_3+K_2)/2$, and $I_D=I_1(K_4+K_1)/2$. So, if $(K_1+K_4)=(K_2+K_3)=(K_3+K_2)=(K_4+K_1)$, the system 10 should perform in a more ideal manner relative to the system 10' of FIG. 1. It should be evident to those of ordinary skill in that art that this is true for any linear gradient, i.e., where $K_n$ increases linearly.

When used as stand-alone DACs, this invention is adapted to improve the dynamic performance of the DAC with respect to INL and DNL. Another use for DACs is in the implementation of Analog to Digital Converters (ADCs).

Figure 3:
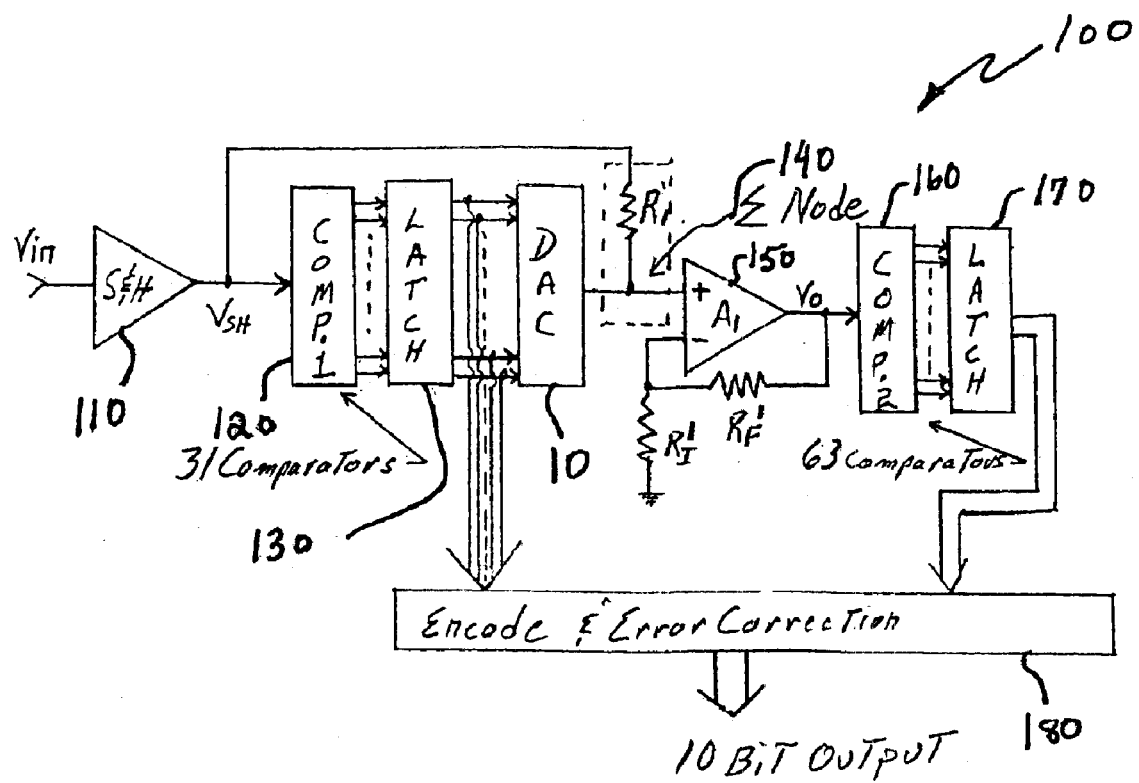
FIG. 3 shows a two stage subranging analog to digital converter utilizing a digital to analog converter implemented in accordance with conventional teachings.

FIG. 3 shows a two stage subranging analog to digital converter (ADC) utilizing a digital to analog converter implemented in accordance with conventional teachings. The ADC 100 includes a sample and hold circuit 110 which feeds a first set of comparators (COMP1) 120. The first set of comparators 120 feed a latch 130. The outputs of the latch are provided to an encoder and error correction circuit 180 and a unary DAC 10 implemented in accordance with the teachings of the present invention. The output of the DAC 10 is provided to the summing node of an operational amplifier 150. The amplifier 150 feeds a second set of comparators 160. The outputs of the second set of comparators (COMP2) 160 are held by a second latch 170 and provided to the encoder and error correction circuit 180.

In a subranging architecture, such as that shown in FIG. 3, the full scale input voltage $\pm V_{IN}$ is divided into, for example, 32 segments by the 31 comparators of COMP1. Then, as appropriate, a current is subtracted out by the DAC 10. This current (there are 31 current sources) is proportional to the instantaneous voltage $V_{SH}$. The 31 current sources are internal to the DAC 10. As an example, if $V_{SH}$ were in mid range then half the current sources would be on and half would be off. The result of these current sources being turned on or off as a function of the amplitude of $V_{SH}$ is the positioning of the amplitude of $V_O$ of A1 to be within the range of the following bank of comparators (COMP2).

The operation of a subranging converter with error correction is well-known to those skilled in the art. Ideally, each DAC current source would be in optimal calibration. If the switches are not in optimal calibration, it could result in non-linearities in the transfer function in the DAC 10. These non-linearities could degrade the ADCs spur-free dynamic range (SFDR). If, for example, there was a gradient error where each current source output slightly more current than the previous one, there would be 31 times that these errors would appear across the full range of the ADC. These cumulative errors would reflect the DNL error caused by each current switch. By minimizing the DAC DNL errors, the invention will improve the dynamic performance of the ADC. For example, if the sample and hold was perfect, the DAC DNL and INL would set the dynamic performance of the ADC.

There are at least two techniques that perhaps could be considered conventional in the implementation of ADCs. Neither is focused on correcting gradient errors.

Figure 4:
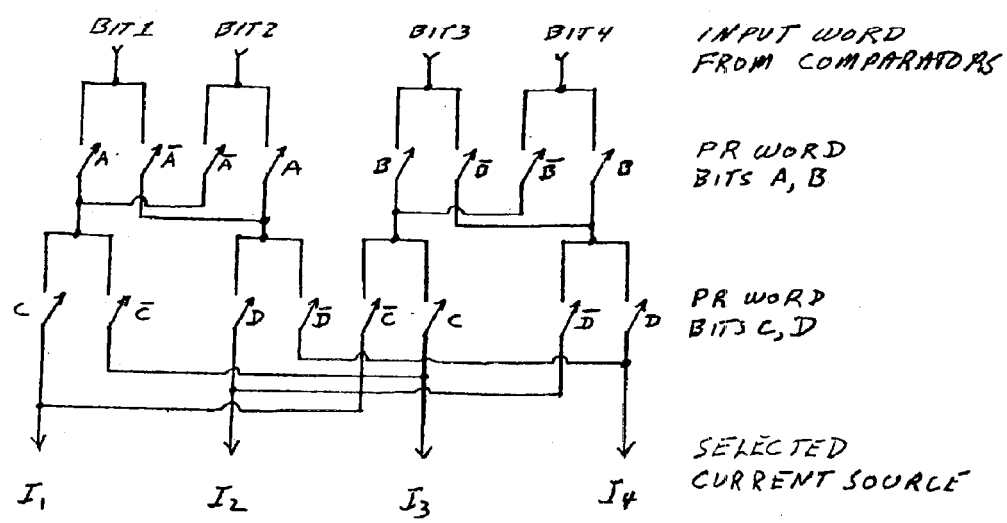
FIG. 4 is a diagram illustrating a 4-bit butterfly configuration in accordance with conventional teachings.

The first could be considered to be a pseudo random (PR) switching of the current sources, with respect to the digital word driving a Stage 1 DAC. This is depicted in FIG. 4 which is a diagram illustrating a 4-bit butterfly configuration in accordance with conventional teachings. A four-switch unary DAC is used as the example. As can be seen, for a given input word (generated by the comparator bank), the current source(s) selected will be different as a function of the PR code. This, in effect, randomizes the error so that it doesn't appear at the same place (input voltage) each time. By doing this, the error is spread around and averaged to reduce its impact on the ADC's Spur Free Dynamic Range (SFDR).

Unfortunately, this technique does nothing to improve the basic problem of DNL error in the current sources. Randomization of the DNL errors raises the noise floor of the DAC since the fixed pattern errors in the DAC DNL are "whitened" and become random noise. The INL of the DAC does, however, improve. In addition, the prior art has severe impact to the DAC settling time. In the context of an ADC application as a reconstruction DAC in the residue path, a delay in the digital bit path will cause a degradation in the maximum clock rate of the ADC. This is a result of the fact that the digital delay and randomizing of the multi-layered butterfly network directly reduces the available settling time for the DAC. Also the digital randomizing and PR generator circuitry require considerable area and power relative to that required by a DAC implemented in accordance with the teachings of the present invention.

The second prior approach could be considered to be the addition of noise dither to the input of the ADC. This noise addition effectively moves the point in the input waveform where the defective current source is used, de-correlating the DNL errors associated with fixed analog values. The analog noise (RMS) can be wideband, narrowband, analog or digital, but needs to be sufficiently large so that the spurious frequencies are adequately reduced. This would improve the SFDR at the expense of either adding noise and/or reducing the dynamic range of the ADC by the amount of noise added. As discussed earlier, this invention is especially effective in correcting gradient errors. As an example, FIG. 5 will show that the DNL and INL errors are taken to zero by implementation of this invention.

The fundamental approach to this invention may best be understood by visualizing the current cells as a linear array across the die. This invention, in essence, splits each current cell into two current sources each having a value of $I_N/2$. The new current sources (two to a cell) are then cross-coupled as described above and shown in FIG. 2.

Figure 5:
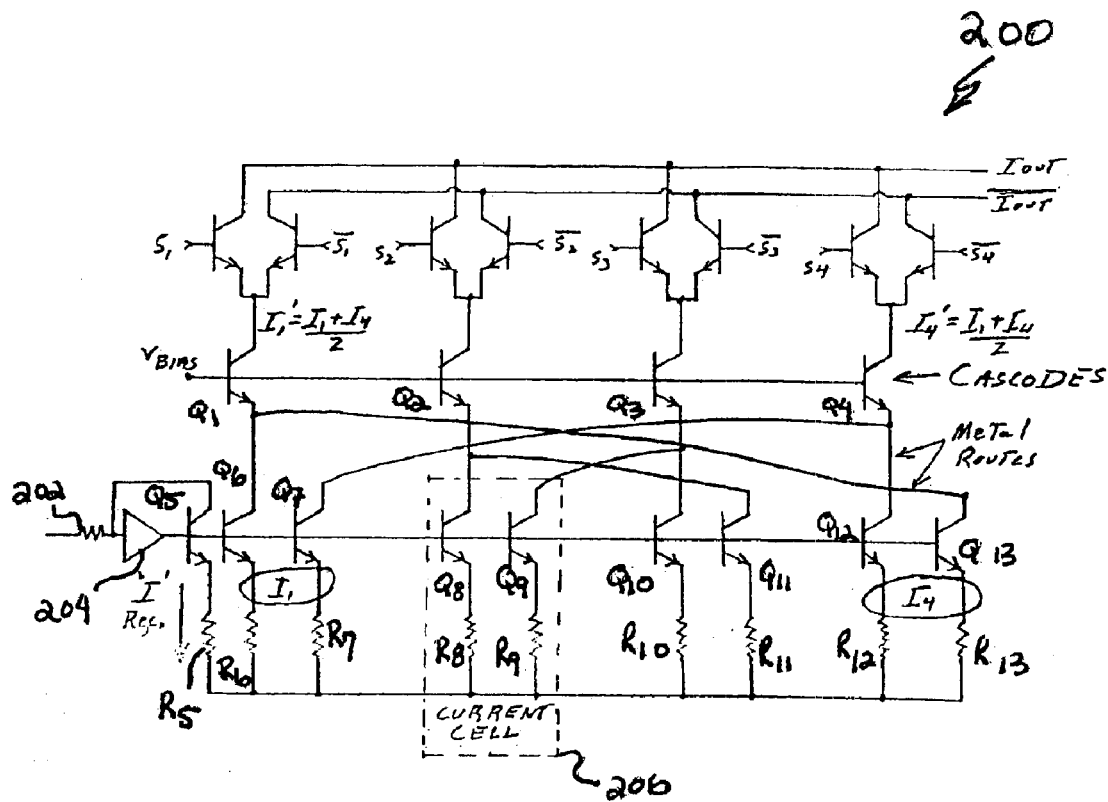
FIG. 5 is a simplified schematic of an arrangement of four split cells in accordance with an illustrative embodiment of the teachings of the present invention.

FIG. 5 is a simplified schematic at the transistor level of an arrangement of four split cells in accordance with an illustrative embodiment of the teachings of the present invention. A plurality of current cells is shown of which one is labeled with reference numeral 206. In the illustrative embodiment, each current cell includes two current sources implemented with a transistor and a resistor coupled to the emitter thereof. (Those skilled in the art will appreciate that the invention is not limited to a cross-coupling to two current sources. That is, three or more current sources may be cross-coupled within the scope of the present teachings.) Thus, for example, cell 206 consists of a first current source comprising transistor $Q_8$ and resistor $R_8$ and a second current source comprising transistor $Q_9$ and resistor $R_9$. Each current source is driven by a reference voltage provided by an amplifier 204 with a current source $Q_5$ in a feedback circuit thereof. The eight current sources in the four cells are cross-coupled to the four cascode transistors in accordance with the present teachings. Each cascode then feeds a pair of transistor switches adapted to provide complementary current outputs. The cascodes serve to isolate the current sources from the current switches.

The embodiment shown in FIG. 5 is implemented in bipolar technology. However, as will be appreciated by those of ordinary skill in the art, the invention is technology independent. The schematic gives an indication of how the split cells may be routed to cascode states. It is critical to have a symmetric layout and match all of the metal routes to the cascodes in order to achieve the same early effect as a result of the DC IR (voltage) drop from each current source to each cascode transistor. The cascodes $Q_1-Q_4$ effectively isolate the current cells and the routing from the switching transistors, thereby not affecting the switch settling time of the DAC.

Other interconnect schemes could be used. For example, if a specific type of gradient error was expected to peak in the center of the array (a second order error), then, instead of cross-coupling from Cell 1 to Cell 15, Cell 2 to 14, etc one would cross-connect Cell 1 to Cell 8, Cell 2 to Cell 7 . . . Cell 9 to 15, Cell 10 to 14, etc. Other gradient types (higher order) could also be addressed and minimized using the techniques addressed by this invention.

It should be noted that even for non-gradient errors, the present invention may offer significant improvements in the DNL and INL errors. In addition, the present teachings may be used with the two techniques described above as prior art (the Butterfly and Dither) if desired. A DAC implemented in accordance with the present teachings should have no adverse impact on speed of operation because the cross coupling is done on steady state currents and the long routes produced as a result of the cross coupling along the array are summed into the cascode stages which isolate the routes from the dynamic switching transistors. The architecture described herein is technology independent and works equally well in CMOS (for $\Delta V_{GS}$) as it does in bipolar for $\Delta \beta$ and $\Delta V_{BE}$.

It should be noted that the present invention may be embodied in forms other than the preferred embodiments described above without departing from the spirit or scope thereof. The specification contained herein provides sufficient disclosure for one skilled in the art to implement the various embodiments of the present invention, including the preferred embodiment, which should be considered in all aspects as illustrative and not restrictive. All changes or alternatives that fall within the meaning and range or equivalency of the illustrations are intended to be embraced within.

Thus, the present invention has been described herein with reference to a particular embodiment for a particular application. Those having ordinary skill in the art and access to the present teachings will recognize additional modifications, applications and embodiments within the scope thereof.

It is therefore intended by the appended claims to cover any and all such applications, modifications and embodiments within the scope of the present invention.

Accordingly,

What is claimed is:

1. A digital to analog converter comprising:
   an operational amplifier;
   a plurality of current cells, each current cell including at least two current sources, wherein each current cell is operatively coupled one of a plurality of current paths, wherein each of said plurality of current paths are operatively coupled to an input terminal of the operational amplifier; and
   a plurality of switches responsive to a digital input signal for switchably coupling current from said plurality of current cells to said plurality of current paths, wherein each of said plurality of switches couple current from current sources of at least two different current cells to a respective current path.

2. The invention of claim 1 further including a resistive element disposed in each of said current paths.

3. The digital to analog converter of claim 1 further including a resistive element disposed between said current paths.

4. The digital to analog converter of claim 1 further including a feedback resistor disposed between an output terminal of said amplifier and said input terminal thereof.

5. The digital to analog converter of claim 1, wherein each of said plurality of switches are adapted to couple, for a respective current path, half of the current from a current source from a current cell, and half of the current from a current source from a different current cell.

* * * * *